Sept. 1, 1970 D. L. CAMPBELL 3,526,847
TEMPERATURE INSENSITIVE AMPLIFIER EMPLOYING
A DIFFERENTIAL STAGE
Filed July 13, 1967
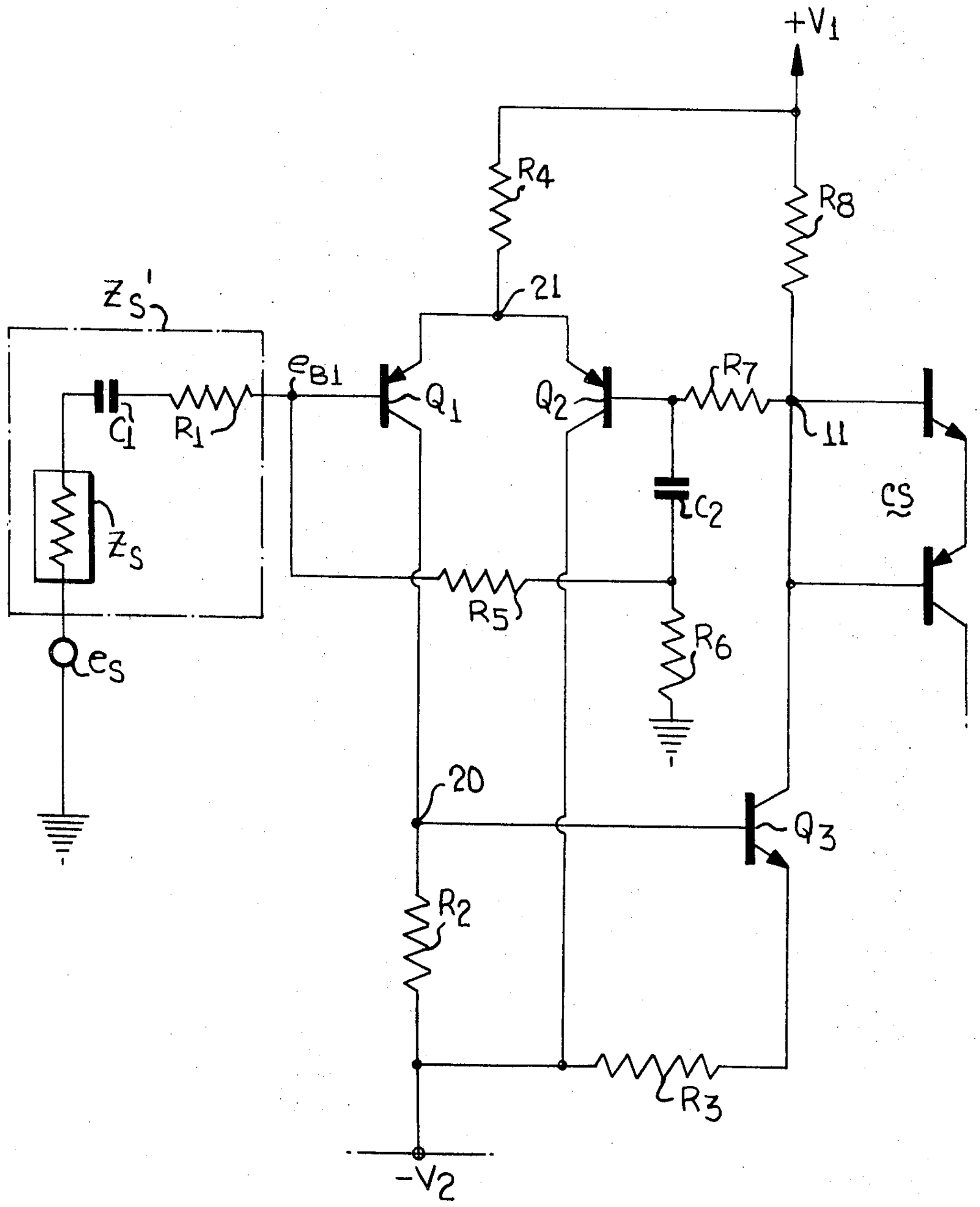
INVENTOR
DAVID L. CAMPBELL
BY Hurvitz, Rose & Greene
ATTORNEYS United States Patent Office 3,526,847
Patented Sept. 1, 1970

3,526,847
TEMPERATURE INSENSITIVE AMPLIFIER EMPLOYING A DIFFERENTIAL STAGE
David L. Campbell, Santa Clara, Calif., assignor to McIntosh Laboratory, Inc., Binghamton, N.Y.
Filed July 13, 1967, Ser. No. 662,241
Int. Cl. H03f *1/08*
U.S. Cl. 330—25 5 Claims

ABSTRACT OF THE DISCLOSURE

A voltage amplifier employing differential input and single ended output, including a differential amplifier stage employing two identical transistors, of which one is driven by input signal and the other differentially to the first by negative feedback signal in a DC feedback negative path and in which the one is driven regeneratively by AC feedback signal, thus effecting temperature compensation and DC balance as well as AC drive and high AC gain, and high input impedance. Input signal as applied to the amplifier via a capacitive-resistive circuit, having circuit values selected in conjunction with the constants of the AC feedback signals, to produce very rapid roll off at low frequencies, with flat response above the roll off point.

BACKGROUND OF THE INVENTION

A wide variety of transistor voltage amplifiers exists, which are capable of amplifying wide band audio signals. Such amplifiers may be capable of driving a quasi-complementary class B stage, which implies that the output load point of the amplifier is at zero volts for zero AC input voltage. Problems remain of compensating for variations of amplifier gain and DC currents as temperature varies, and of maintaining the zero volt DC output value as temperature varies, while providing a high gain AC amplification factor linearly over a wide band, and high input impedance for the amplifier.

The problem further exists of obtaining low frequency response, say to 10 c.p.s., without at the same time providing high output at low frequencies of the order of 1–3 c.p.s. due to the slow roll off which would exist in a conventional amplifier at low frequencies. The present invention provides a very rapid roll off, from some frequency which may be established in the design of the system.

SUMMARY OF THE INVENTION

A signal is applied to the base of a first transistor, associated with a second transistor in a differential pair. The first transistor feeds a load resistor which drives an output transistor. The latter feeds back DC signal degeneratively to the second transistor, the base of the first transistor being maintained at ground positive absent an AC signal. The load point of the output transistor is maintained at ground potential by DC feedback into the differential pair. The amplifier is thus suitable for driving a quasi-complementary class B amplifier.

Use of a differential pair in the amplifier assures that temperature effects, in respect to both DC level and AC output, are minimized and temperature drift components are essentially random, rather than systematic. Essentially this is because in a differential pair, employing nominally identical transistors, changes in one transistor are balanced out by corresponding charges in the other, and because the system is arranged to have DC feedback sufficient to provide zero decibel DC closed loop gain.

An AC feedback regenerative loop is provided, back to the base of the first transistor from the negative feedback point. This loop is capacitive and as frequency decreases eventually introduces loss of fed back signal and phase shift, which decreases gain. The input circuit of the amplifier is also capacitive, and employs circuit constants much like those in the feedback loop, so that the net feedback phase shifts and signal attenuations are cumulative, and roll off of about 18 decibels per octave can be attained. Normal RC circuits yield about 6 decibels per octave. The amplifier can be designed to have a flat frequency response down to 10 c.p.s., and thereafter to roll off 30 decibels at 3 c.p.s. This characteristic is particularly valuable when the amplifier is used with an FM tuner, the output of which, in tuning through a station, provides slowly varying DC voltage, involving very low frequencies.

Summarizing, DC feedback is provided in the present system to stabilize bias and switch zero DC gain and thus to maintain zero volts at its output for zero volts signal input. AC controlled regenerative feedback is provided, which is regenerative to provide controlled AC output with high amplification. Temperature effects are largely eliminated by employing a differential amplifier. High rate of roll off at low frequencies is attained by the feedback circuit, and by the design of the input circuit. Furthermore, the impedance at the base of first transistor is very high due to the use of positive feedback, and is of the order of 300,000 ohms, although actual resistance values employed are quite low.

DESCRIPTION OF THE DRAWINGS

The single figure of the drawings is a schematic circuit diagram of a voltage amplifier according to the invention.

DESCRIPTION OF THE PREFERRED EMBODIMENT

An AC wide audio signal is applied to the base of PNP transistor Q1, for amplification thereby. The emitter of Q1 is connected via load resistance R4 to a positive voltage source +V1. The collector of Q1 is connected via load resistance R2 to a negative voltage source —V2. The voltage at the collector of Q1 is applied via lead 10 to the base of NPN transistor Q3, the emitter of which is connected via resistance R3 to —V2 and the collector of which is connected to the +V1 via resistance R8. Point 11 is then an output point for the amplifier, and this point may be coupled to the bases of a complementary symmetry driven amplifier CS, very generally indicated, and forming no part of the invention.

The point 11 is connected via series resistance R7 (3000Ω) to the base of PNP transistor Q2, the emitter of which is directly connected to the emitter of Q1 and the collector of which is directly connected to —V2.

The base of Q2 is accordingly driven by DC voltage which is variable and degenerative with respect to variations of characteristics of Q1, and which maintains point 11 at zero DC voltage, i.e., at ground potential. DC gain is zero. R4 provides a load for voltage at the emitter of Q2, which carries DC current due to Q2, which varies in opposite sense to the current in R4 due to Q1. Q1 and Q2 thus provide a differential amplifier pair, and it is the difference current which provides a drive signal across R2 for the transistor Q3. In order for CS to operate, it must be supplied with AC signal of alternate polarity with respect to ground, and under quiescent conditions point 11 must be a ground point.

The base of Q1 is connected to ground via resistance R5 (3000Ω) and resistance R6 (150Ω) in series. The junction of R5 and R6 is coupled to the base of Q2 via capacitor C2. For zero input signal, therefore, the base of Q1 is at ground potential and the resistances and voltages are so selected that point 11 is at ground voltage by virtue of the differential action of the circuits of transistors Q1, Q2, Q3.

The transistors Q1 and Q2 must be assumed temperature sensitive. However, their conductivities will change approximately together, on average, and the temperature drift is therefore essentially random, i.e., is compensated except for small random amounts, due to small random inequalities of temperature coefficients, for Q1 and Q2.

Transistors in general have about 2–3 millivolt changes per degree centigrade, so that in a high gain amplifier, temperature drift can cause 2–3 tenths of a volt change per degree, or 20 v. for a 100°C. change, which is of the same order of magnitude as the output signal voltage in the present amplifier.

In the present system temperature effects are improved by about three orders of magnitude, for two reasons. One reason is that the amplifier is differential, and therefore temperature effects tend to cancel out. If the two sides of the amplifier were perfectly balanced there would be no temperature effects. A second reason is that the closed loop DC gain of the amplifier is zero decibels, and any departure of point 11 from ground potential is compensated by the DC feedback.

An amplifier with no AC gain is, of couse, useless. To provide AC gain, AC output voltage is coupled in capacitor C2 across R6, and that voltage applied to the base of Q1 via R5, i.e., regeneratively as seen by load R2. Relative values of R7, R6, R5 establish the extent of degenerative AC feedback at Q2 and of positive AC feedback at Q1. The capacitor C2 is chosen to have negligible impedance at midrange and accordingly the voltage gain of the amplifier is determined by the ratio of R7 to R6, and is in fact $$\frac{R6+R7}{R6}$$

The amplifier as described to this point has excellent DC stability, is not temperature sensitive, and has an AC gain which may be readily selected in terms of values of R7 and R6, which together form a voltage divider.

The input circuit of the amplifier provides AC coupling, i.e., signal source $\epsilon_s$, having internal impedance $Z_s$, is coupled to the base of Q1 via series capacitor C1 and resistance R1 (1000Ω). The total impedance of $Z_s$, C1 and R1 are taken to be $Z_s'$, and the separate impedances are each of the same order of magnitude at low frequencies.

The signal at the junction of C2 and R6, which is fed back via R5 to provide positive AC feedback will suffer attenuation and phase shift as signal frequency decreases and the reactance of C2 approaches the resistance of R6. Also the input AC signal is applied in series with R1, C1, and $Z_s$, and itself suffers like attenuation and phase shift as signal frequency decreases.

As frequency decreases, the impedance of $Z_s'$ increases, attenuating the signal. In addition, phase shift occurs. The fed back AC signal is subject to a similar attenuation and phase shift. $Z_s'$, R5 and R6 form a voltage divider, the values of the components of which establish voltage at $\epsilon_{B_1}$ for a given $\epsilon_s$. However, feedback voltage at the junction of C2 and R6, i.e., across R6, opposes current flow down through R5, and therefore the circuit R5, R6 looks like a high impedance. As the voltage across R6 decreases, with decrease of frequency, the apparent impedance of R5, R6 decreases and permits drain of current from point $\epsilon_{B_1}$, decreasing the voltage at that point. The effects are cumulative and result in a rapid decrease of gain. At sufficiently low frequencies AC loop gain can approach zero.

Conventional amplifiers fall off in frequency response at about 6 decibels per octave, due to the input coupling capacitor, but the present system can provide cut-off at about 18 decibels per octave. The present system is linear in frequency response to within ±1 decibel down to 10 c.p.s. and is down about 30 decibels at 3 c.p.s. This is desirable because the amplifier may be supplied with signal from an FM tuner. The frequency discriminator of an FM tuner supplies very low frequencies, essentially slowly varying DC, as one tunes through an FM station. It is desired that such signals not produce audible response, and further, such signals can damage a loudspeaker load of a power amplifier. The high rate of roll off of the present invention provides very high attenuation at very low frequencies without at the same time restricting the linear response band of the amplifier.

Considering the differential pair of Q1, Q2, in respect to DC operation, if the emitter to collector impedance of Q1 decreases, the voltage at point 20 increases, due to an increase in current flow. This increases the bias at the base of Q3, increasing its current, which reduces voltage at point 11 and decreases the impedance of Q2 and tends to lower the voltage at junction 21. That voltage tends to decrease when the impedance of Q2 decreases, and increases the impedance of transistor Q1. Point 11 is assumed at zero voltage initially. Any tendency for that point to increase or decrease with respect to zero volts then leads to a compensatory voltage change at junction 21, which in turn returns the voltage of point 21 to its correct value.

What I claim is:

1. An audio amplifier including
- a first transistor having a first base electrode,
- a source of wideband audio signal connected as an input signal to only said first base electrode,
- a second transistor having a second base electrode,
- means connecting said first and second transistors in a differential configuration, said means including
- means for amplifying the output of said differential configuration to derive an amplified DC and wideband audio output signal,
- a direct current circuit applying said amplified DC output signal to only said second base electrode in degenerative phase,
- an alternating current circuit applying said wideband audio output signal only degeneratively to said second base electrode and only regeneratively to said first base electrode,
- wherein is provided means biasing said first base electrode to ground potential, and
- wherein said means for amplifying includes
- a third transistor having a collector, and
- a voltage supply and resistive load circuitry for said third transistor providing nominally ground potential for said collector.

2. A transistor audio voltage amplifier, including
- a first PNP transistor having first base, emitter and collector electrodes,
- a second PNP transistor having second base, emitter and collector electrodes,
- a source of wideband audio signal coupled as input solely to said first base,
- a positive voltage terminal,
- a negative voltage terminal,
- a first resistance,
- a second resistance,
- means connecting said first resistance between said positive voltage terminal and said first emitter,
- means connecting said second resistance between said negative voltage terminal and said first collector electrode,
- means connecting said first emitter electrode directly to said second emitter electrode,
- means connecting said second collector electrode directly to said negative terminal,
- a DC circuit connected between said first base electrode and ground for biasing said first electrode at ground potential,
- DC circuit means responsive to the voltage across said second resistance and coupled degeneratively to said second base electrode, only,
- AC means for feeding only audio voltage regeneratively from said second base electrode to said first base electrode, and wherein said DC circuit means includes an NPN transistor having third base, emitter and collector electrodes, means connecting said third base electrode directly to said first collector electrode, a third resistance connected between said positive voltage terminal and said third collector electrode, a fourth resistance connected between said negative voltage terminal and said third emitter electrode, said third and fourth resistances and the voltages of said terminals being selected to provide nominal ground potential at said third collector electrode, said DC circuit including a DC feedback resistance connected directly between said third collector electrode and said second base electrode.

3. The combination according to claim 2 wherein said AC means includes:

a capacitor and an AC feedback resistance connected in the order named between said second base electrode and ground, and a further resistance connected between the junction of said capacitor and AC feedback resistance and said first base electrode, said DC feedback resistance and said further resistance having approximately the same values.

4. The combination according to claim 3 wherein is further provided a signal input circuit connected between ground and said first base electrode, said signal input circuit including a series capacitor having at least approximately the same value as the first mentioned capacitor.

5. The combination according to claim 4 wherein the values of said capacitors and the further impedance of said signal input circuit and the value of said further resistance are selected to provide a roll off of at least 12 db per octave from a predetermined infrasonic frequency such that the gain of said amplifier below three c.p.s. is negligible.

References Cited

UNITED STATES PATENTS

| | | | |
|---|---|---|---|
| 2,852,625 | 9/1958 | Nuut | 330—30 X |
| 3,271,694 | 9/1966 | Brown | 330—28 X |
| 3,366,889 | 1/1968 | Avins | 330—30 X |
| 3,378,780 | 4/1968 | Lin | 330—25 X |

FOREIGN PATENTS

| | | |
|---|---|---|
| 1,295,540 | 5/1962 | France. |

ROY LAKE, Primary Examiner

J. B. MULLINS, Assistant Examiner

U.S. Cl. X.R.

330—28, 30